United States Patent
Fishkin et al.

(10) Patent No.: US 6,218,306 B1
(45) Date of Patent: Apr. 17, 2001

(54) METHOD OF CHEMICAL MECHANICAL POLISHING A METAL LAYER

(75) Inventors: Boris Fishkin, San Carlos; Kapila Wijekoon, Santa Clara; Ronald Lin, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/064,928

(22) Filed: Apr. 22, 1998

(51) Int. Cl.[7] .......................... H01L 21/768; B24B 37/04
(52) U.S. Cl. ............................................ 438/692; 438/959
(58) Field of Search ................................ 438/691, 692, 438/693, 959

(56) References Cited

U.S. PATENT DOCUMENTS

| | | | |
|---|---|---|---|
| 3,841,031 | 10/1974 | Walsh | 51/283 |
| 4,944,836 | 7/1990 | Beyer et al. | |
| 5,361,545 | 11/1994 | Nakamura | 451/287 |
| 5,395,801 | 3/1995 | Doan et al. | 437/225 |
| 5,514,245 | * 5/1996 | Doan et al. | 438/691 |
| 5,618,381 | * 4/1997 | Doan et al. | 438/633 |
| 5,700,383 | * 12/1997 | Feller et al. | 438/692 |
| 5,709,588 | 1/1998 | Muroyama | 451/41 |
| 5,738,574 | * 4/1998 | Tolles et al. | 438/692 |
| 5,786,275 | 7/1998 | Kubo | 438/692 |
| 5,804,507 | 9/1998 | Perlov et al. | 438/692 |
| 5,889,328 | 3/1999 | Joshi et al. | 257/751 |
| 5,913,712 | * 6/1999 | Molinar | 438/691 |
| 6,001,730 | * 12/1999 | Farkas et al. | 438/627 |

FOREIGN PATENT DOCUMENTS

| | | |
|---|---|---|
| 0 558 004 A3 | 9/1993 | (EP). |
| 2326 281 | 12/1998 | (GB). |
| 193130 | 7/1995 | (JP). |

* cited by examiner

Primary Examiner—Mary Wilczewski
(74) Attorney, Agent, or Firm—Fish & Richardson

(57) ABSTRACT

In the formation of metal vias, plugs or lines, a metal layer is deposited onto a non-planar non-metallic surface of a substrate. The metal layer is chemical mechanical polished with a first polishing pad until the metal layer is substantially planarized and a residual layer having a thickness about equal to the depth of potential microscratches, between about 200 and 1000 angstroms, remains over the non-metallic surface. The residual layer is chemical mechanical polished with a second, softer polishing pad until the non-metallic surface is exposed and the residual layer is removed.

13 Claims, 5 Drawing Sheets

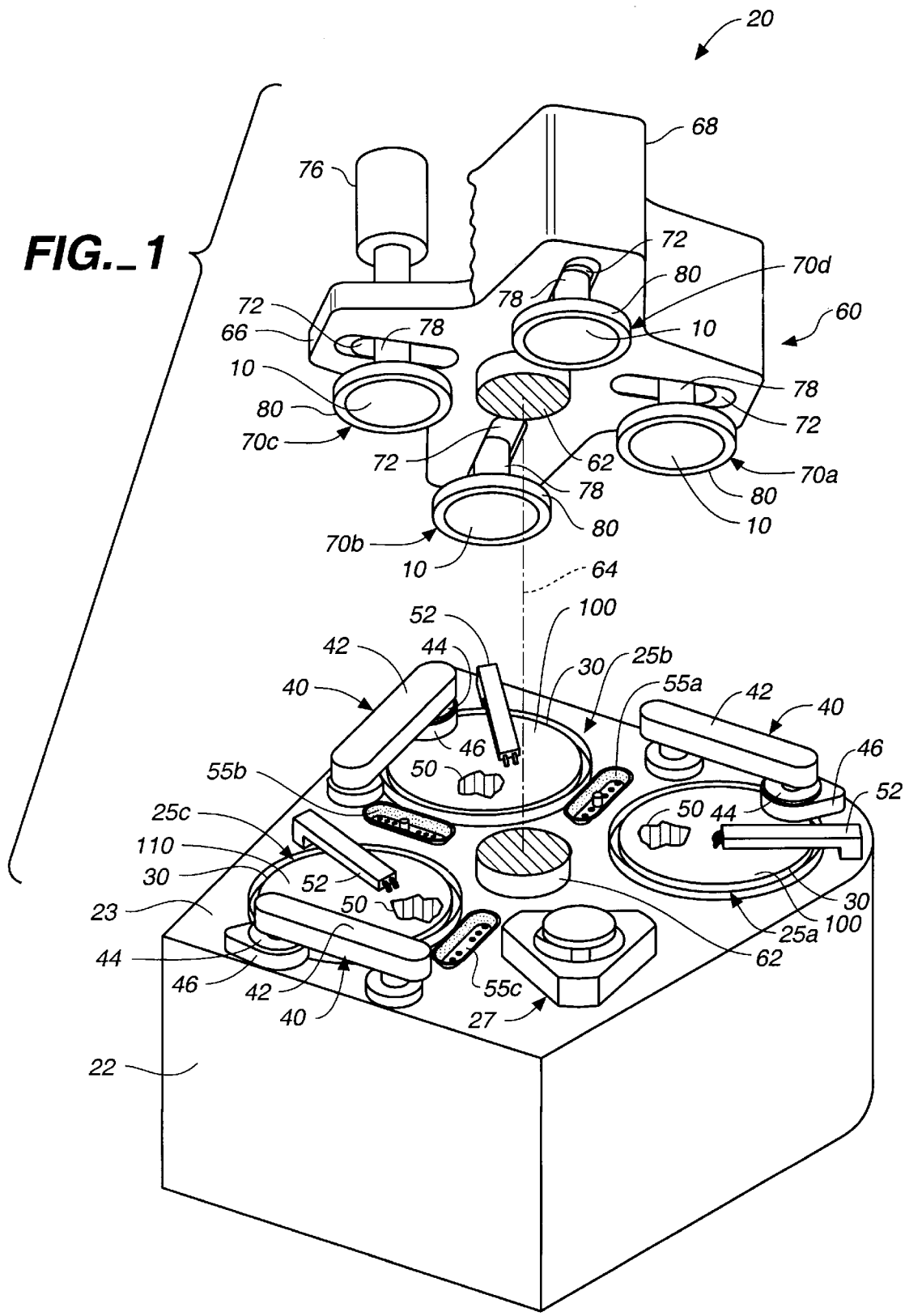
FIG._1

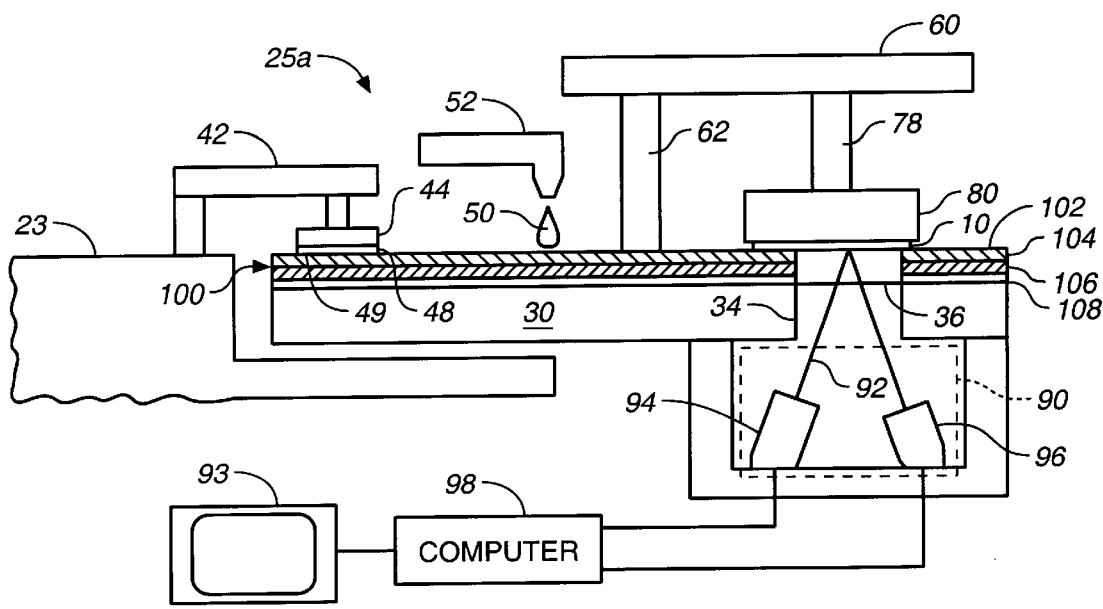
FIG._2A
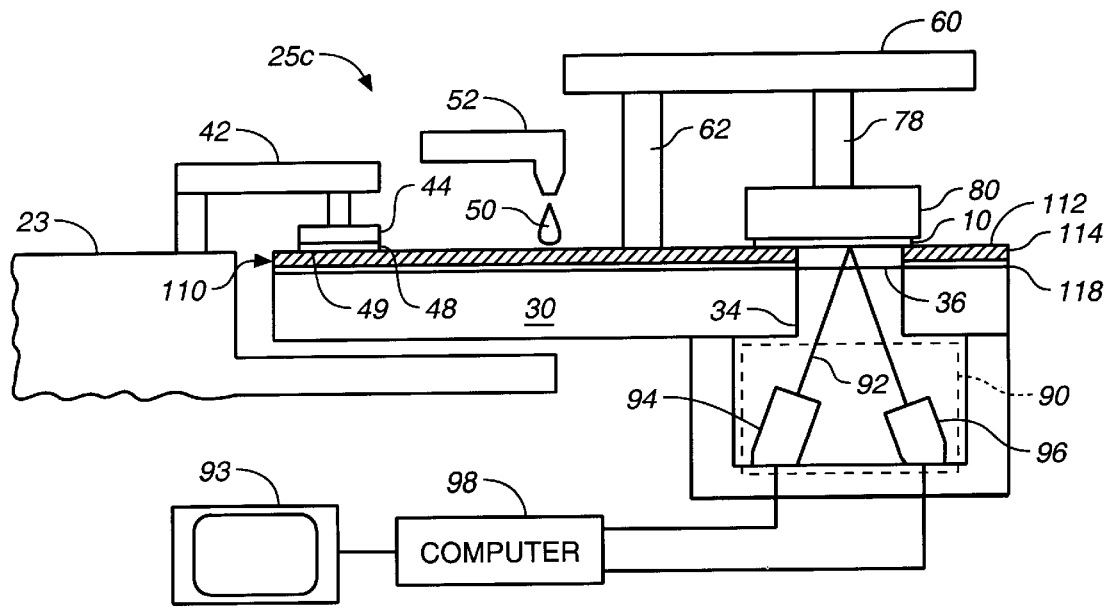
FIG._2B

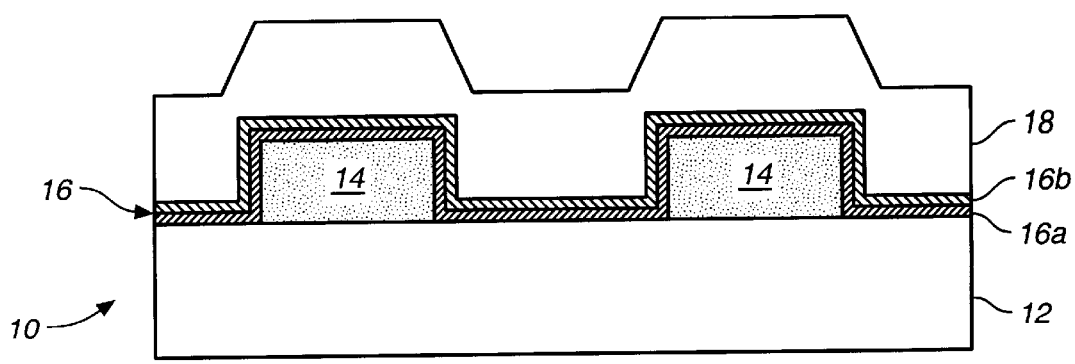
FIG._3A
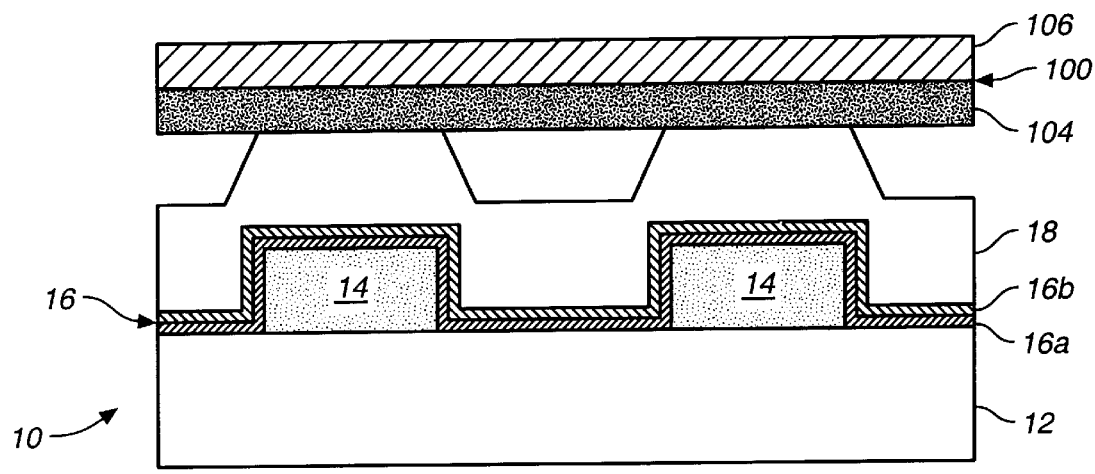
FIG._3B
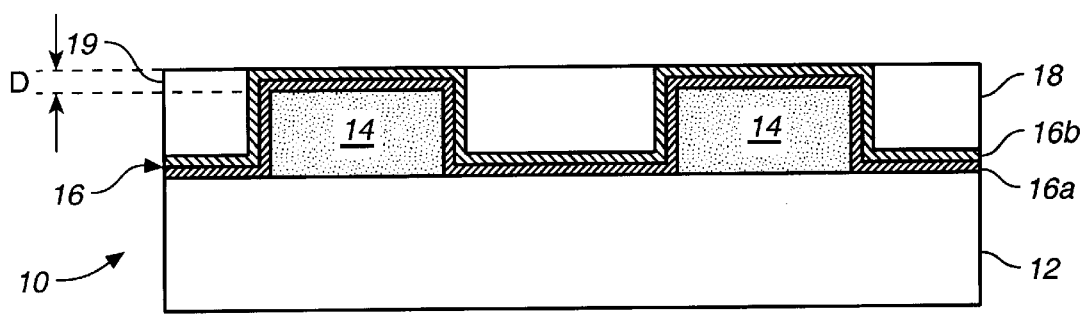
FIG._3C

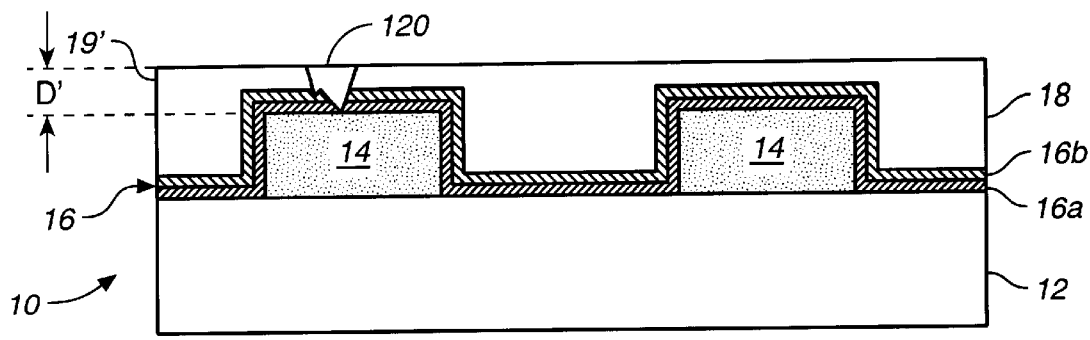
FIG._3D
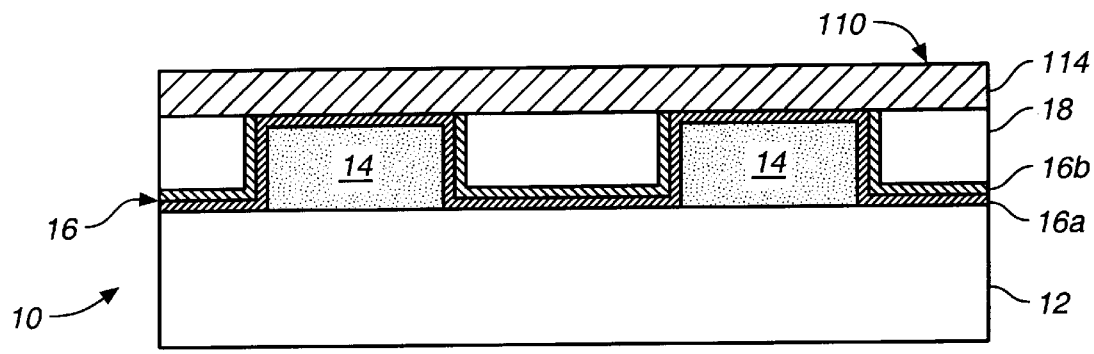
FIG._3E
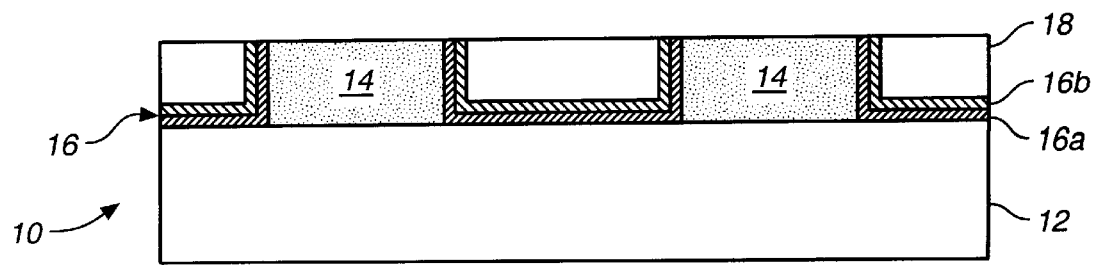
FIG._3F

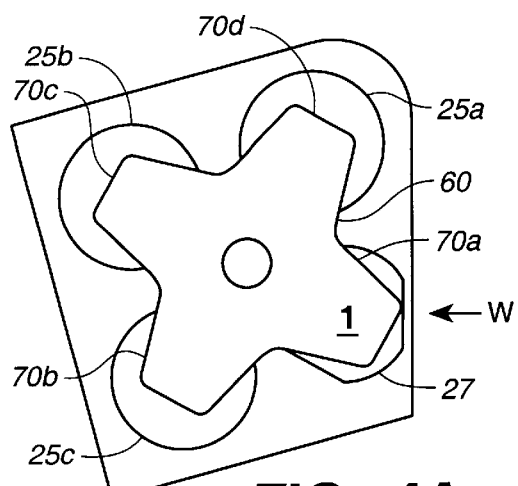
FIG._4A
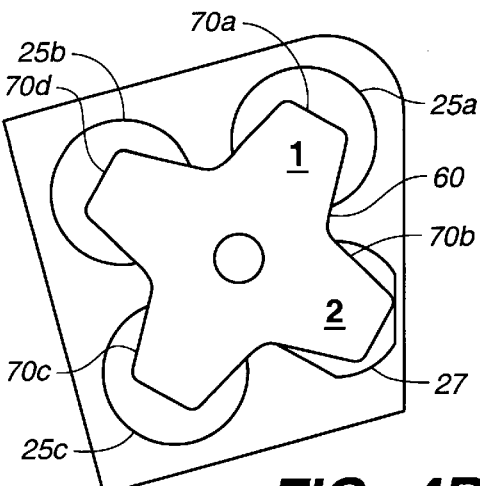
FIG._4B
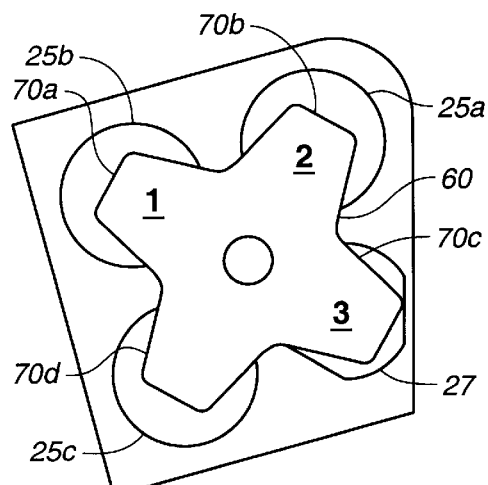
FIG._4C
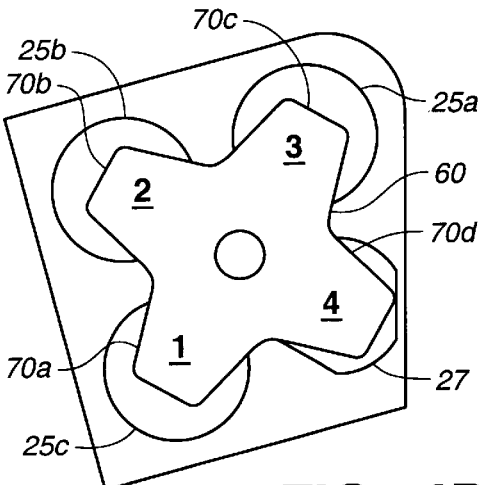
FIG._4D
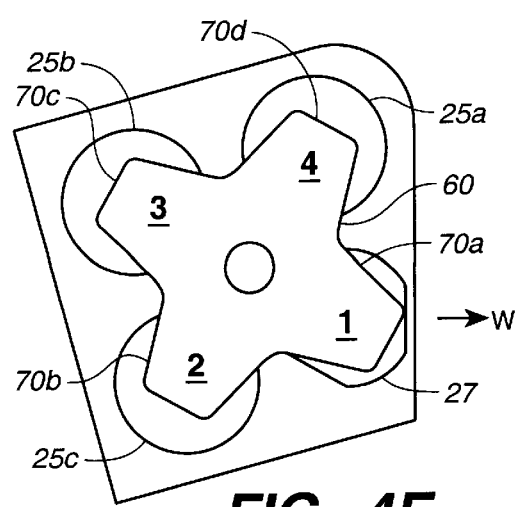
FIG._4E
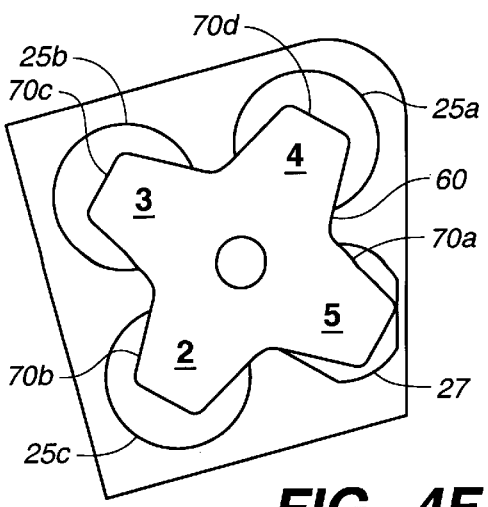
FIG._4F

METHOD OF CHEMICAL MECHANICAL POLISHING A METAL LAYER

BACKGROUND

The present invention relates generally to chemical mechanical polishing of substrates, and more particularly to a method of polishing a metal layer.

An integrated circuit is typically formed on a substrate by the sequential deposition of conductive, semiconductive or insulative layers on a silicon wafer. After each layer is deposited, the layer may be etched to create circuitry features. One fabrication step involves the formation of metal vias, plugs and lines to provide conductive paths between thin film circuits. Metal vias can be created by depositing a metal layer over a patterned insulative layer and then planarizing the metal layer until the insulative layer is exposed. The portions of the metal layer remaining between the raised pattern of the insulative layer form the metal vias, plugs and lines.

Chemical mechanical polishing (CMP) is one accepted method of planarization. This planarization method typically requires that the substrate be mounted on a carrier or polishing head. The exposed surface of the substrate is placed against a rotating polishing pad. The polishing pad may be either a "standard" pad or a fixed-abrasive pad. A standard pad has a durable roughened surface, whereas a fixed-abrasive pad has abrasive particles held in a containment media. The carrier head provides a controllable load, i.e., pressure, on the substrate to push it against the polishing pad. A polishing slurry, including at least one chemically-reactive agent, and abrasive particles if a standard pad is used, is supplied to the surface of the polishing pad.

An effective CMP process not only provides a high polishing rate, but also provides a substrate surface which is finished (lacks small-scale roughness) and flat (lacks large-scale topography). The polishing rate, finish and flatness are determined by the pad and slurry combination, the relative speed between the substrate and pad, and the force pressing the substrate against the pad. The polishing rate sets the time needed to polish a layer. Because inadequate flatness and finish can create defective substrates, the selection of a polishing pad and slurry combination is usually dictated by the required finish and flatness. Given these constraints, the polishing time needed to achieve the required finish and flatness sets the maximum throughput of the CMP apparatus.

A reoccurring problem in metal CMP is the so-called "microscratching" of the substrate surface. Specifically, some CMP processes create shallow grooves, e.g., on the order of 500 angstroms deep, in the substrate surface. These grooves render the substrate finish unsuitable for integrated circuit fabrication, lowering the process yield.

Another problem relates to slurry waste. In some metal polishing processes, two slurries, one acidic and one alkaline, are delivered to two polishing pads in the CMP apparatus. Since the two slurries have an opposite pH, the slurry drainage system must be designed so that the slurries do not mix when they are drained from the polishing pad.

SUMMARY

In one aspect, the invention is directed to a method of forming a patterned metal layer on a substrate. In the method, a metal layer is formed on a non-planar, non-metallic surface of the substrate, and the metal layer is chemical mechanical polished with a slurry and a first polishing pad until the metal layer is substantially planarized and a residual layer remains over the non-metallic surface. The residual layer has a thickness approximately equal to the depth of a potential microscratch. The residual layer is chemical mechanical polished with the slurry and a second polishing pad which is softer than the first polishing pad until the non-metallic surface is exposed.

Implementations of the invention may include the following. The non-metallic layer may be overpolished to assure that the entire residual layer is removed. A barrier layer may be formed between the non-metallic layer and the metal layer, and the residual layer may include a portion of the barrier layer. The non-metallic layer may be over-polished to assure that the entire barrier layer is removed. The first chemical mechanical polishing step may include polishing at a plurality of polishing stations, whereas the second chemical mechanical polishing step may include polishing at a single polishing station. The residual layer may have a thickness between about 200 and 1000 angstroms. The slurry may be acidic.

In another aspect, the invention is directed to a method of forming a patterned metal layer on a substrate in which a metal layer is formed on a non-planar, non-metallic surface of the substrate, and the metal layer is chemical mechanical polished with a slurry and a first polishing pad until the metal layer is substantially planarized and a residual layer having a thickness between about 200 and 1000 angstroms remains over the non-metallic surface. The residual layer is chemical mechanical polished with the slurry and a second polishing pad which is softer than the first polishing pad until the non-metallic surface is exposed.

Advantages of the invention may include the following. Microscratch defects are reduced or eliminated, thereby increasing process yield. The CMP process uses only one slurry, permitting the CMP apparatus to be constructed with a simpler and less expensive slurry supply and slurry drainage system. In addition, the throughput of the CMP apparatus and the finish of the resulting substrates are improved.

Other features and advantages will be apparent from the following description, including the drawings and claims.

BRIEF DESCRIPTION OF THE DRAWINGS

FIG. 1 is a schematic exploded perspective view of a chemical mechanical polishing apparatus.

FIG. 2A is a schematic cross-sectional view of the first polishing station of the CMP apparatus of FIG. 1.

FIG. 2B is a schematic cross-sectional view of the final polishing station of the CMP apparatus of FIG. 1.

FIGS. 3A–3F are schematic cross sectional views of a substrate illustrating the method of the present invention.

FIGS. 4A–4F illustrate the motion of the carousel and the movement of substrates through the CMP apparatus.

DETAILED DESCRIPTION

Referring to FIG. 1, one or more substrates 10 will be polished by a chemical mechanical polishing apparatus 20. A description of polishing apparatus 20 may be found in U.S. Pat. No. 05/738,574, entitled RADIALLY OSCILLATING CAROUSEL PROCESSING SYSTEM FOR CHEMICAL MECHANICAL POLISHING, filed Oct. 27, 1995 by Ilya Perlov, et al., and assigned to the assignee of the present invention, the entire disclosure of which is incorporated herein by reference. Polishing apparatus 20 includes a lower machine base 22 with a table top 23 mounted thereon and a removable outer cover (not shown). Table top 23 supports a series of polishing stations, including a first polishing station 25a, a second polishing station 25b, and a final polishing station 25c, and a transfer station 27. Transfer station 27 forms a generally square arrangement with the three polishing stations 25a, 25b and 25c. Transfer station 27 serves multiple functions, including receiving individual substrates 10 from a loading apparatus (not shown), washing the substrates, loading the substrates into carrier heads, receiving the substrates from the carrier heads, washing the substrates again, and finally, transferring the substrates back to the loading apparatus.

Each polishing station includes a rotatable platen 30 on which is placed a polishing pad. The first and second stations 25a and 25b may include a relatively hard polishing pad 100, whereas the final polishing station may include a relative soft polishing pad 110. If substrate 10 is an "eight-inch" (200 millimeter) or "twelve-inch" (300 millimeter) diameter disk, then the platens and polishing pads will be about twenty inches or thirty inches in diameter, respectively. Each platen 30 may be a rotatable aluminum or stainless steel plate connected to a platen drive motor (not shown). For most polishing processes, the platen drive motor rotates platen 30 at thirty to two hundred revolutions per minute, although lower or higher rotational speeds may be used.

Each polishing station 25a–25c may further include an associated pad conditioner apparatus 40. Each pad conditioner apparatus 40 has a rotatable arm 42 holding an independently-rotating conditioner head 44 and an associated washing basin 46. Conditioner head 44 may include a stainless steel disk 48, the underside of which is coated with an abrasive layer 49 (see FIG. 2A). The abrasive layer 49 may be formed of small, hard, corrosion-resistant particles, e.g., 68 micron diameter diamonds electroplated to the disk with a thin layer of nickel. The pad conditioner apparatus 40 maintains the condition of the polishing pad so that it will effectively polish substrates.

A metal polishing slurry 50 containing deionized water, abrasive particles (e.g., silica or alumina particles for tungsten polishing), an acidic component (e.g., an acid with a pH of about 2 for tungsten polishing), and an oxidizer (e.g., hydrogen peroxide for tungsten polishing) is supplied to the polishing pad surface by a combined slurry/rinse arm 52. The slurry/rinse arm may include two or more slurry supply tubes to provide slurry to the surface of the polishing pad. Sufficient slurry may be provided to cover and wet the entire polishing pad. Slurry/rinse arm 52 also includes several spray nozzles (not shown) which provide a high-pressure rinse of the polishing pad at the end of each polishing and conditioning cycle.

Two or more intermediate washing stations 55a and 55b may be positioned between neighboring polishing stations 25a, 25b and 25c. The washing stations rinse the substrates as they pass from one polishing station to another.

A rotatable multi-head carousel 60 is positioned above lower machine base 22. Carousel 60 is supported by a center post 62 and is rotated thereon about a carousel axis 64 by a carousel motor assembly located within machine base 22. Center post 62 supports a carousel support plate 66 and a cover 68. Carousel 60 includes four carrier head systems 70a, 70b, 70c, and 70d. Three of the carrier head systems receive and hold substrates, and polish them by pressing them against the polishing pads on the platens of polishing stations 25a–25c. One of the carrier head systems receives a substrate from and delivers a substrate to transfer station 27.

The four carrier head systems 70a–70d are mounted on carousel support plate 66 at equal angular intervals about carousel axis 64. Center post 62 allows the carousel motor to rotate carousel support plate 66 and to orbit carrier head systems 70a–70d and the substrates attached thereto about carousel axis 64.

Each carrier head system 70a–70d includes a carrier or carrier head 80. A carrier drive shaft 78 connects a carrier head rotation motor 76 (shown by the removal of one quarter of cover 68) to carrier head 80 so that each carrier head 80 can independently rotate about its own axis. There is one carrier drive shaft and motor for each head. In addition, each carrier head 80 independently laterally oscillates in a radial slot 72 formed in carousel support plate 66. A slider (not shown) supports each drive shaft in its associated radial slot. A radial drive motor (not shown) may move the slider to laterally oscillate the carrier head.

The carrier head 80 performs several mechanical functions. Generally, the carrier head holds the substrate against the polishing pad, evenly distributes a downward pressure across the back surface of the substrate, transfers torque from the drive shaft to the substrate, and ensures that the substrate does not slip out from beneath the carrier head during polishing operations.

The carrier head 80 may include a flexible membrane (not shown) which provides a substrate receiving surface. A description of a suitable carrier head 80 may be found in U.S. patent application Ser. No. 08/745,679, entitled a CARRIER HEAD WITH a FLEXIBLE MEMBRANE FOR a CHEMICAL MECHANICAL POLISHING SYSTEM, filed Nov. 8, 1996, by Steven M. Zuniga et al., assigned to the assignee of the present invention, the entire disclosure of which is incorporated herein by reference.

Referring to FIG. 2A, an aperture or hole 34 is formed in each platen 30 and a transparent window 36 is formed in a portion of polishing pad 100 overlying the hole. The transparent window 36 may be constructed as described in U.S. patent application Ser. No. 08/689,930, entitled METHOD OF FORMING a TRANSPARENT WINDOW IN a POLISHING PAD FOR a CHEMICAL MECHANICAL POLISHING APPARATUS by Manoocher Birang, et al., filed Aug. 26, 1996, and assigned to the assignee of the present invention, the entire disclosure of which is incorporated herein by reference. The hole 34 and transparent window 36 are positioned such that they have a "view" of substrate 10 during a portion of the platen's rotation, regardless of the translational position of the polishing head. A laser interferometer 90 is located below platen 30. The laser interferometer includes a laser 94 and a detector 96. The laser generates a collimated laser beam 92 which propagates through transparent window 36 to impinge upon the exposed surface of substrate 10.

Laser 94 is activated to generate laser beam 92 during a time when hole 34 is adjacent substrate 10. In operation, CMP apparatus 20 uses laser interferometer 90 to determine the amount of material removed from the surface of the substrate, or to determine when the surface has become planarized. A general purpose programmable digital computer 98 may be connected to laser 94 and detector 96. Computer 98 may be programmed to activate the laser when the substrate overlies the window, to store measurements from the detector, to display the measurements on an output device 93, and to detect the polishing endpoint, as described in aforementioned U.S. patent application Ser. No. 08/689,930.

Referring to FIG. 2A, at first and second polishing stations 25a and 25b, the platen may support a polishing pad 100 having a roughed surface 102, an upper layer 104 and a lower layer 106. Lower layer 106 may be attached to platen 30 by a pressure-sensitive adhesive layer 108. Upper layer 104 may be harder than lower layer 106. For example, upper layer 104 may be composed of microporous polyurethane or polyurethane mixed with a filler, whereas lower layer 106 may be composed of compressed felt fibers leached with urethane. A two-layer polishing pad, with the upper layer composed of IC-1000 or 1C-1400 and the lower layer composed of SUBA-4, is available from Rodel, Inc. of Newark, Del. (IC-1000, IC-1400 and SUBA-4 are product names of Rodel, Inc.).

Referring to FIG. 2B, at final polishing station 25c, the platen may support a polishing pad 110 having a generally smooth surface 112 and a single soft layer 114. Layer 114 may be attached to platen 30 by a pressure-sensitive adhesive layer 118. Layer 114 may be composed of a napped poromeric synthetic material. A suitable soft polishing pad is available from Rodel, Inc., under the trade name Politex. Polishing pad 110 may be embossed or stamped with a pattern to improve distribution of slurry across the face of the substrate. Polishing station 25c may otherwise be identical to polishing stations 25a and 25b.

FIGS. 3A–3D illustrate the process of chemical-mechanically polishing a metal layer. As shown in FIG. 3A, substrate 10 includes an insulative layer 14, such as silicon dioxide, disposed on a semiconductive layer, such as a silicon wafer 12. The insulative layer 14 is either patterned or disposed on a patterned underlying layer so that it has a non-planar outer surface. A barrier layer 16, which may include a lower layer 16a composed of titanium and an upper layer 16b composed of titanium nitride, is disposed on the outer surface of insulating layer 14 and any exposed surfaces of any underlying layers. Finally, a metal layer 18, such as tungsten, is disposed over barrier layer 16. The outer surface of metal layer 18 almost exactly replicates the underlying structures of insulative layer 14, creating a series of peaks and valleys so that the exposed surface of the substrate is non-planar.

As discussed above, one purpose of planarization is to polish metal layer 18 until the top surface of insulative layer 14 (i.e., the surface below barrier layer 16) is exposed, thus leaving metal vias between the insulative islands, and metal plugs in any holes in the insulative layer (see FIG. 3F). Unfortunately, one problem with metal polishing is the creation of microscratches in the outer surface of the resulting substrate, e.g., in both the metal vias and the insulative islands. Without being limited into particular theory, one possible cause of the microscratches is the presence of particulates from conditioner head 44. The acidic solution of the polishing slurry may corrode the electroplated nickel of the conditioner head, leaving flecks of electroplated nickel and diamond particles on the polishing pad. In addition, the used slurry and polishing products can agglomerate and create particulates. During polishing with the hard polishing pad, this debris is pressed against the substrate to gouge shallow grooves, i.e., microscratches 120 (see FIG. 3D), in the substrate surface.

Referring to FIG. 3B, substrate 10 is initially polished at polishing stations 25a and 25b with a metal polishing slurry, such as SSW-2000, available from Cabot Corp., Aurora, Illinois, and one or more hard, rough polishing pads 100. As shown in FIG. 3C, the substrate is polished until a residual film 19 having a thickness D remains over insulative layer 14. The residual film 19 may include part or all of barrier layer 16. Alternatively, as shown in FIG. 3D, a residual film 19' with a thickness D' may include barrier layer 16 and a portion of metal layer 18. The thickness of the residual film is approximately equal to the depth of the microscratches 120. Specifically, the thickness D or D' may be about 200 to 1,000 angstroms. The laser interferometer 90 (see FIG. 2A) may be used to determine when the substrate has been polished until a residual layer with the desired thickness remains.

Then, referring to FIG. 3E, the substrate is polished at final polishing station 25c using the same metal polishing slurry as used at polishing stations 25a and 25b. Since the same metal polishing slurry is used at each polishing station, CMP apparatus 20 may be constructed with a simpler and less expensive slurry drainage system. The substrate is polished using soft polishing pad 110 until residual film 19 or 19' is removed and insulative layer 14 is exposed, as shown in FIG. 3F. The microscratches caused by polishing with the hard pad at polishing stations 25a and 25b are removed by polishing away the residual film with soft polishing pad 110. Thus, microscratch defects are reduced and process yields increased. In addition, the majority of the metal layer is planarized quickly by use of the hard polishing pads, thereby providing high throughput. Furthermore, in contrast to polishing methods in which only buffing is performed at the final station and the final station lies idle while polishing is performed at the first and second stations, a part of the barrier layer is removed at the third polishing station, thus decreasing the polishing time at the first and second polishing stations and further increasing throughput.

FIGS. 4A–4F show carrousel 60 and its movement with respect to the insertion of a substrate such as a wafer (W) and subsequent movement of carrier head systems 70a–70d. As shown in FIG. 4A, a first wafer W#1 is loaded into transfer station 27, where the wafer loaded into a carrier head, e.g., that of first carrier head system 70a. Carousel 60 is then rotated counterclockwise on the supporting center post so that, as shown in FIG. 4B, first carrier head system 70a with wafer W#1 is positioned at first polishing station 25a, which performs a first polish of wafer W#1 using a hard polishing pad. While first polishing station 25a is polishing wafer W#1, a second wafer W#2 is loaded into transfer station 27 and from there to a second carrier head system 70b. Then carousel 60 is again rotated counterclockwise by 90 degrees so that, as shown in FIG. 4C, first wafer W#1 is positioned over second polishing station 25b and second wafer W#2 is positioned over first polishing station 25a. The third carrier head system 70c is positioned over transfer station 27, from which it receives a third wafer W#3 from the loading system. As previously noted, the polishing pad at station 25b is also a hard polishing pad.

During the process stage shown in FIG. 4C, wafer W#1 at second polishing station 25b is polished until the residual film 19 or 19' having thickness D or D', respectively, remains over the insulative layer. Once this endpoint is determined, polishing at polishing station 25b stops.

Then, as illustrated by FIG. 4D, carousel 60 is again rotated counterclockwise by 90 degrees so as to position wafer W#1 over final polishing station 25c, wafer W#2 over second polishing station 25c, and wafer W#3 over first polishing station 25a, while a fourth carrier head system 70d receives a fourth wafer W#4 from transfer station 27. As noted, the polishing pad at final polishing station 25c is softer than the polishing pads at polishing stations 25a and 25b. Wafer#1 is polished with the soft polishing pad at polishing station 25c until the insulative layer is exposed. Thereafter, polishing at polishing station 25c stops, and the wafer and the polishing pad are rinsed with deionized water to remove the slurry.

When polishing has been completed at each polishing station, carrousel 60 is again rotated. However, rather than rotating it counterclockwise by 90 degrees, carousel 60 is rotated clockwise by 270 degrees. The rotation, as shown in FIG. 4E, places wafer W#1 over transfer station 27, wafer W#2 over final polishing station 25c, wafer W#3 over second polishing station 25b, and wafer W#4 over first polishing station 25a. While wafers W#2–W#4 are being polished, wafer W#1 is washed at transfer station 27 and removed from the polishing apparatus. Finally, as illustrated by FIG. 4F, a fifth wafer W#5 is loaded into first carrier head system 70a. After this stage, the process is repeated for wafer W#5.

The invention is not limited to the embodiment depicted and described. Rather, the scope of the invention is defined by the appended claims.

What is claimed is:

1. A method of forming a patterned metal layer on a substrate, comprising:

forming a metal layer on a non-planar, non-metallic surface of the substrate;

chemical mechanical polishing the metal layer with a first polishing pad until the metal layer is substantially planarized and a residual layer remains over the non-metallic surface, the residual layer having a thickness between an outer surface of the metal layer and the non-metallic surface approximately equal to the depth of a potential microscratch in the metal layer; and chemical mechanical polishing the residual layer with a second polishing pad which is softer than the first polishing pad until the non-metallic surface is exposed.

2. The method of claim 1, further comprising overpolishing the non-metallic layer to assure that the entire residual layer is removed.

3. The method of claim 1, further comprising forming a barrier layer between the non-metallic layer and the metal layer.

4. The method of claim 3, wherein the residual layer includes a portion of the barrier layer.

5. The method of claim 4, further comprising supplying slurries to the first polishing pad and the second polishing pad.

6. The method of claim 5, wherein the same slurry is used to polish the metal layer and the barrier layer.

7. The method of claim 3, further comprising overpolishing the non-metallic layer to assure that the entire barrier layer is removed.

8. The method of claim 1, wherein the first chemical mechanical polishing step includes polishing at a plurality of polishing stations.

9. The method of claim 1, wherein the second chemical mechanical polishing step includes polishing at a single polishing station.

10. The method of claim 1, wherein the residual layer has a thickness between about 200 and 1000 angstroms.

11. The method of claim 1, further comprising supplying a slurry to the first and second polishing pads.

12. The method of claim 11, wherein the same slurry is supplied to the first and second polishing pads.

13. The method of claim 11, wherein the slurry is acidic.

* * * * *